United States Patent [19]

Zatler et al.

[11] Patent Number: 5,532,527
[45] Date of Patent: Jul. 2, 1996

[54] LEVEL SWITCH

[76] Inventors: Andrej Zatler, Aškerčeva 24, 62000, Maribor; Franc Eferl, Pri šli 45, 62351, Kamnica, both of Slovenia

[21] Appl. No.: 3,768

[22] Filed: Jan. 13, 1993

[30] Foreign Application Priority Data

May 6, 1992 [SI] Slovenia ................... 9200073

[51] Int. Cl.⁶ ............... G01F 23/00; H01H 35/00
[52] U.S. Cl. .................. 307/118; 73/304 R; 73/304 C; 324/662; 340/612
[58] Field of Search .............. 73/304 R, 304 C; 324/662, 671, 681, 724, 707; 307/118, 112, 116, 125; 340/612, 618, 620

[56] References Cited

U.S. PATENT DOCUMENTS

| | | |
|---|---|---|
| 3,412,220 | 11/1968 | Puppolo et al. . |
| 3,956,760 | 5/1976 | Edwards . |
| 4,188,549 | 2/1980 | Dorais ........................ 307/308 |
| 4,214,479 | 7/1980 | Maier . |
| 4,855,706 | 8/1989 | Hauptly ....................... 338/34 |
| 4,952,914 | 8/1990 | Mueller ....................... 340/620 |
| 5,046,583 | 9/1991 | Sasaki et al. ................. 184/6.4 |
| 5,097,703 | 3/1992 | Peter .......................... 73/304 C |
| 5,275,951 | 1/1994 | Chow et al. ................... 73/304 C |
| 5,287,086 | 2/1994 | Gibb .......................... 340/618 |

FOREIGN PATENT DOCUMENTS

| | | |
|---|---|---|
| 0155179 | 9/1985 | European Pat. Off. . |
| 0288215 | 10/1988 | European Pat. Off. . |
| 399824 | 11/1990 | European Pat. Off. . |
| 0441381A1 | 8/1991 | European Pat. Off. . |
| 0518836A1 | 12/1992 | European Pat. Off. . |
| 2720006 | 11/1977 | Germany . |
| 2819731 | 12/1979 | Germany . |
| 2932051 | 3/1980 | Germany . |
| 282515 | 9/1990 | Germany . |
| 2751864 | 1/1991 | Germany . |
| 4217305 | 12/1993 | Germany . |
| 58-172520 | 10/1983 | Japan . |

Primary Examiner—William M. Shoop, Jr.
Assistant Examiner—Jonathan S. Kaplan
Attorney, Agent, or Firm—Keck, Mahin & Cate

[57] ABSTRACT

A level switch includes an operational amplifier, provided with positive and negative feedback, and a sensor, together forming an astable multivibrator. The oscillation onset and frequency of the multivibrator depend on the surface level of controlled material. The sensor includes a dielectric body on which, starting from its fastening end, a grounded opposite electrode and a screening electrode, connected to the amplifier output, are mounted. A ring plate connected to the inverting amplifier input is incorporated coaxially in the dielectric body. The level switch need not be adjusted when the controlled material is changed, although materials may have quite different electrical properties and may stick to the sensor.

13 Claims, 3 Drawing Sheets

LEVEL SWITCH

BACKGROUND OF THE INVENTION

1. Technical Field

This application relates to a level switch which detects that the surface of a material contained within a tank has reached the level of a sensor belonging to the level switch.

2. Description of the Prior Art

Level switches of this kind are applicable e. g. in silos, storage tanks or reservoirs, which may be open or closed, exposed to atmospheric pressure, to a variable or a steady pressure. Materials contained therein may be quite diverse: liquid, granular or powdery materials of different density, viscosity and adherence, pure or mixed with rigid particles of different size, with air bubbles, with a surface foam, homogeneous or inhomogeneous, with steady or variable electric properties. The application range of a single known level switch is rather restricted and usually the level switch must be adjusted to the material contained in a tank.

The level detection is based on different principles. There are known mechanical, electromechanical and hydrostatic level switches, ultrasonic level switches, capacitive and conductive level switches, microwave level switches, optical and radiometric level switches.

Mechanical and electromechanical level switches are suitable for liquids only. Owing to a float and transmission rods, they are sensitive to deposits, to rigid particles contained in a liquid, to turbulences and to foam on the liquid surface.

Capacitive level switches are universal to a greater degree. The capacity of the measuring capacitor within a sensor varies according to the surface level displacement of the material contained in a tank since the permittivity value of the material differs from 1.

There has been known a capacitive sensor with a circuitry (FTC 968, described in Handbuch für Ingenieure; Sensoren, Meßaufnehmer, Neue Verfahren und Produkte für die Praxis, 2nd edition, pages 521 to 529, Expert Verlag, Ehningen bei Boblingen (1988)) to sense the filling level of a tank containing fine-granular bulk material (grain size up to 10 mm) with the permittivity value exceeding 1.6. The sensor is designed so that the interfering influence due to a sticking material deposit is eliminated automatically. The sensor is made of a hollow plastic cylinder closed at one end, within which a measuring electrode is mounted on the cylinder base and also partially on the jacket. In addition, on the inner wall of the sensor cylinder jacket a screening electrode and a grounded terminal ring electrode are mounted. On the screening electrode a circuitry multivibrator at a constant frequency of 0.5 MHz builds up a potential, which varies with a phase delay with respect to the measuring electrode potential. Thereby it is achieved that electric field lines built up between the measuring electrode and the terminal ring electrode are pushed out by the screening electrode. Therefore the electric field lines project from the material sticking on the sensor. The described level switch is suitable for a dry bulk material, however, it is not suitable for an electrically conductive moist bulk material.

Further, a capacitive level switch (model 23 and 25 of company VEGA, Germany) has been known which is also suitable for electrically conductive and heavily sticking materials. A completely insulated rod sensor comprises a guard screen electrode which compensating the effect of a layer of a sticking material. The guard screen electrode shunts the undesired electric current flowing through this layer from the sensor tip to the fixing part.

All known capacitive level switches must be adjusted to the material contained in a tank, and their read-outs are not appropriate any more as soon as the material parameters have been changed. Likewise, there has been known no level switch, by which a change from an electrically conductive material to an electrically non-conductive one, from a sticking material to a non-sticking one and so forth could be accomplished without a former adjustment. Thus by known level switches the problem of detecting a drop of a material having the electrical conductivity below 0.1 mS/cm and not sticking to the level switch sensor can still be solved, whereas this is for a sticking material not feasible by any level switch, neither by a capacitive nor by a conductive one. In such extreme case an ultrasonic or radiometric level meter are applied, which, however, is an expensive and demanding solution and not always feasible as regards design or otherwise.

Known conductive level switches are suitable for materials with the electrical conductivity above 3 µS/cm and must be adjusted to respective material contained in a tank. There is applied a sensor with mutually distant electrodes surrounded by the material contained in the tank, one of the electrodes being connected to an oscillator of frequency in the range between 3 kHz and 4 kHz. The oscillator feeds a bridge circuit, in whose one arm the level switch sensor and in the other arm a potentiometer to adjust to the material contained in the tank are connected. The bridge circuit signal is conducted to a comparator and thereafter, across a filter suppressing interfering signals, to an output amplifier. The electrical resistance of the material between the sensor electrodes is representable as a voltage drop on a constant resistance comprised in the circuit, which voltage drop is conducted further to a comparator. In the comparator the switching operating point must be set.

There is known a level switch (VEGATOR 261 A of VEGA, Germany) in which uniquely among level switches of this kind no adjustment is needed when the material contained in a tank is changed. The sensor is provided with three ring electrodes separated from each other and having different surfaces, which electrodes are connected to an oscillator of a constant frequency of 4 kHz. A balance of resistances of the material between electrodes renders it possible that the level switch can operate in materials with a low electrical conductivity between 1 µS/cm and 15 µS/cm. However, this level switch is not suitable for materials, like distilled water, with very low electrical conductivity.

SUMMARY OF THE INVENTION

In accordance with the foregoing background discussion, the object of this invention is to provide a level switch which, by means of the frequency value of a signal generated in the circuit of the level switch, detects a sinking of the surface of a material under the level of a sensor belonging to the level switch, which material can have very different properties being liquid, granular or powdery as well as electrically conductive or non-conductive and also sticking or non-sticking, yet does not require an adjustement of the level switch to a new material each time the material in a tank has been changed.

Advantageously, the level switch of the invention does not need to be adjusted each time the material in a tank is changed even if the materials have quite different properties;

actually they may be electrically conductive or non-conductive, sticking or non-sticking, liquid, powdery, granular, pasty or doughy. Another advantage of the level switch of the invention is also that its electronic circuit is simple and composed of few elements.

Other objects, advantages and features of the invention will be apparent from the following detailed description of the embodiments thereof, when read in conjunction with the accompanying drawings.

DETAILED DESCRIPTION OF THE PREFERRED EMBODIMENTS

Figure 1:
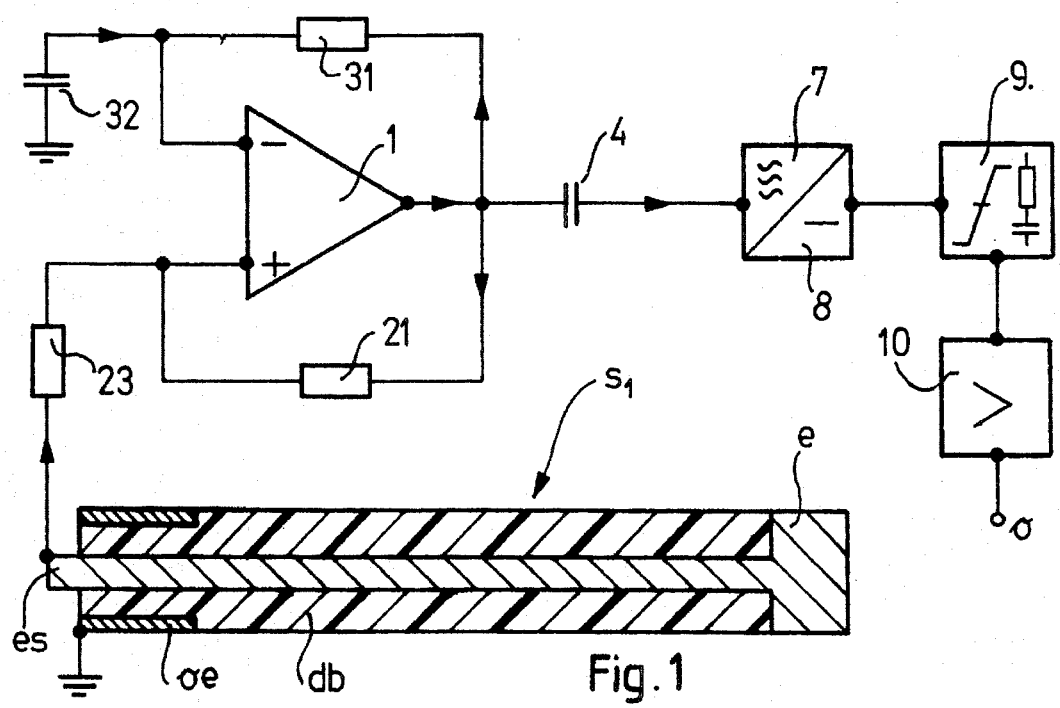
FIG. 1 represents a conductive level switch as the first embodiment of the level switch according to the invention.

In all four embodiments the level switch according to the invention is represented by a sensor $s_j$ (j=1 to 4) and by a circuit belonging hereto (FIGS. 1, 2, 3 and 4), a relay and/or an alarm system (not represented) being connected to the circuit output. The sensor $s_j$ is always made of a cylindrical dielectric body db and provided with an annular opposite electrode oe, which surrounds one end of the dielectric body db in the peripheral direction and is grounded or, in the practical application connected to a tank containing a material. In all embodiments of the level switch an operational amplifier 1 is provided with positive and negative feedback accomplished by a resistor 21 and a resistor 31, respectively, and together with the sensor $s_j$ it constitutes an oscillator. The oscillator frequency depends on the physical conditions around the sensor $s_j$, the oscillator output voltage, however, is constant and advantageously it is chosen to be the saturation voltage of the operational amplifier 1. The output of the operational amplifier 1 connected to the input of a signal shaping circuit. The output of the signal shaping circuit is also the output o of the level switch. The signal shaping circuit is composed of a low-frequency band filter 7, a rectifier 8, an amplitude limiter 9 suppressing remaining peaks, which amplitude limiter is essentially composed of a Zener-diode and a capacitor, and of an amplifier 10, all components connected in series.

The level switch according to the invention in the first embodiment is constructed as a conductive level switch (FIG. 1). A cylindrical dielectric body db of the sensor $s_1$ is terminated by the electrode e at one of its free ends. The electrode stem es of the electrode e axially penetrates the dielectric body db jutting out at the other end of the dielectric body db. The electrode stem es and thereby also the electrode e is connected through a resistor 23, to the non-inverting input of the operational amplifier 1, the inverting input of which is connected to the level switch ground through a capacitor 32. The output of the operational amplifier 1 is connected to the input of a low-frequency band filter 7 through a capacitor 4 functioning as a high-frequency filter.

The voltage at the non-inverting input of the operational amplifier 1 depends on the resistance of the material between the electrodes e, oe since the non-inverting input of the operational amplifier 1 is grounded through the resistor 23, the electrode e, the material between the electrodes e and oe and through the electrode oe. This voltage, however, influences the charging and discharging rate of the capacitor 32 through a resistor 31. Thus the oscillator frequency is determined by the electrical conductivity and the distribution of the material surrounding the sensor $s_1$.

The parameters of the passive components included in the oscillator, hence also the surface of the electrodes e, oe and their mutual distance, are determined so that alternating signal amplitudes are assumed to be equal in both half periods, which means that the influence of galvanic phenomena must be suppressed. Now the oscillator frequency is set at a value of approximately 3 kHz for materials with a high electrical conductivity of about 0.1 S/cm and at a value of approximately 300 Hz for materials with a low electrical conductivity of about 10 μS/cm. These relations are known to the expert and can be explained by complex phenomena accompanying electric current transfer between two electrodes where a frequency dependent phase delay of the current to voltage appears.

For this reason it is convenient to determine the resistor 31 and the capacitor 32 so that at the output of the operational amplifier 1 always the saturation voltage is reached. This was accomplished e. g. for materials with the electrical conductivity between 10 μS/cm and 0.1 S/cm. By changing the passive components of the oscillator the bottom limit of the conductivity intervail can be lowered down to the electrical conductivity of distilled water, i. e. to 2 μS/cm. In this case also the upper limit of the intervail is lowered to 0.01 S/cm.

When, however, the surface level of a sticking material sinks under the level of the sensor $s_1$ of the conductive level switch, a thin material layer remains sticking to the sensor $s_1$. The ohmage and the inductance of this layer for an alternating current between the electrodes e and oe increase and the oscillator frequency decreases. Now the capacitor 4 only lets pass a weak electric current, which strongly influences the voltage at the output o. For weakly sticking materials the capacitor 4 of the same capacity is applied for both electrically highly or weakly conductive materials. However, for electrically highly conductive materials having a conductivity between 1 mS/cm and 100 mS/cm the capacity of the capacitor 4 must be reduced to such an extent that the signal will be reduced considerably if the material sticks so intensely that on the sensor $s_1$ a thick layer remains sticking when the material surface is withdrawn under the level of the sensor $s_1$.

Accordingly, the conductive level switch as the first embodiment of the level switch according to the invention operates at a constant voltage amplitude on the oscillator output, changing, however, the oscillator frequency when the surface level of the material contained in the tank drops under the level of the sensor $s_1$. Hence the level switch behaviour is set simply through the capacity of the capacitor 4. By the same electronic circuit the materials with the electrical conductivity between 10 μS/cm and 0.1 S/cm are covered, i. e. all materials of interest to the industry and otherwise of technical interest.

The level switch according to the invention distinguishes itself by the fact that it does not need to be adjusted to the material contained in the tank and that it is reliable. The excellent reliability of the level switch is revealed particularly when it must operate protecting from a complete material discharge or from a shortage of the material contained in the tank.

Figure 2:
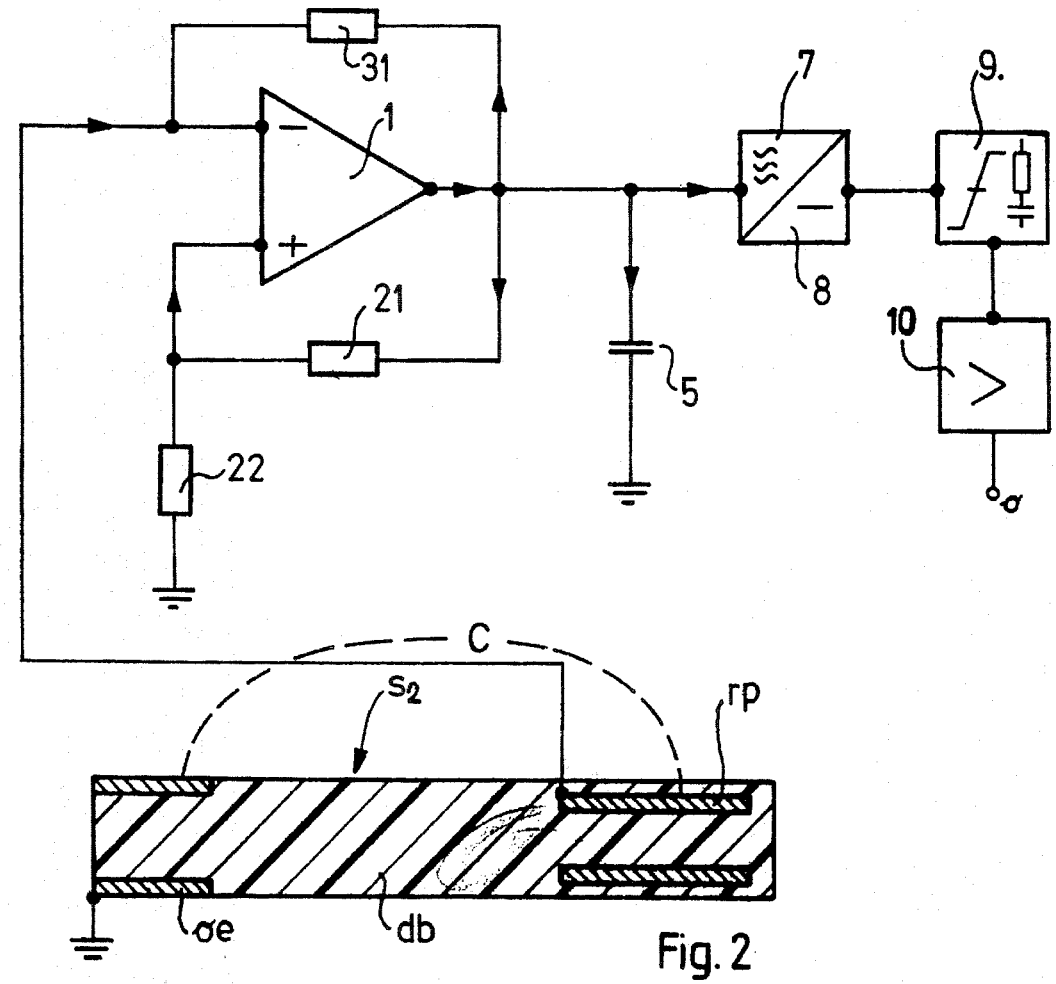
FIG. 2 represents a capacitive level switch in the basic arrangement as the second embodiment of the level switch according to the invention.

The level switch according to the invention in the second embodiment is constructed as a capacitive level switch in the basic arrangement (FIG. 2). A ring plate rp is coaxially incorporated in the dielectric body db of the sensor $s_2$ near to the free end of the dielectric body db, which ring plate rp is connected to the inverting input of the operational amplifier 1. Hence the ring plate rp is separated through the layer of the dielectric body db from the material contained in the tank and surrounding the sensor $s_2$.

In the second embodiment of the level switch according to the invention as well as in the third and fourth one, the grounded resistor 22 is connected with its second terminal to the non-inverting input of the operational amplifier 1, the output of which is grounded through a capacitor 5.

The output voltage of the operational amplifier 1 brings about the charging and discharging of a virtual capacitor C, which appears between the ring plate rp and the opposite electrode oe and which is actually connected to the negative feedback of the operational amplifier 1. The charging and discharging rate of the capacitor C certainly depend on the capacity of the capacitor C, i. e. on the permittivity, the electrical conductivity and the distribution of the material surrounding the dielectric body of the sensor $s_2$ in the space in which the electric field lines pass between the ring plate rp and the opposite electrode oe, as well as on the voltage at the inverting input of the operational amplifier 1. This voltage, however, can be adjusted with respect to the voltage at the output of the operational amplifier 1 by an appropriate ratio of the resistances of the resistors 21, 22. Therefore at chosen parameters of the passive elements in the capacitive level switch, the oscillator frequency depends only on the properties and on the distribution of the material surrounding the sensor $s_2$. Nevertheless, when laying out the actual sensor $s_2$ the oscillator frequency is determined by the surface areas and the diameters of the annular opposite electrode oe and of the ring plate rp, by their mutual longitudinal distance as well as by the permittivity of the cylindrical dielectric body db.

At the capacitive level switch the requirement for equal amplitudes of the alternating current in both half periods is not put so severely as at the conductive level switch. The parameters of the passive oscillator elements are determined so that the amplitude of the output voltage of the operational amplifier 1 reaches the saturation point of the operational amplifier 1.

In case of an electrically well conductive material contained in the tank the capacitive level switch in the basic arrangement operates as follows. Owing to the high electrical conductivity the opposite electrode oe apparently moves towards the ring plate rp, whereby the capacity of the capacitor C increases, namely the more the higher the electrical conductivity of the material is. As soon as the sensor $s_2$ is surrounded by an electrically well conductive material, the oscillator frequency decreases, more at a high electrical conductivity, e. g. 0.1 S/cm and less at a lower electrical conductivity, e. g. 2 µS/cm. However, if the material surface level sinks under the level of the sensor $s_2$, the material remains sticking to the sensor $s_2$ as a thin layer. Thereby the capacity of the capacitor C drops and the oscillator frequency increases. The capacitor 5, however, conducts the high-frequency signal appearing at the output of the operational amplifier 1 to the ground. Accordingly, the capacitor 5 functions accordingly as a low-frequency filter.

In case of an electrically weakly conductive and intensely sticking material a higher capacity of the capacitor 5 is chosen.

The capacitive level switch of the described arrangement is, however, also very appropriate for electrically non-conductive materials. Since in any case the permittivity of the material exceeds the value 1, now the material presence is reflected, if compared to the situation when the material surface sinks under the level of the sensor $s_2$, merely in the increase of the capacity of the capacitor C and thereby in the decrease of the oscillator frequency.

The capacitive level switch in the basic arrangement of the invention is particularly appropriate for non-sticking materials with the electrical conductivity between 0.2 µS/cm and 1 mS/cm.

An advantage with respect to known capacitive level switches is a spontaneous adjustment of the oscillator frequency when materials with different electrical conductivities or permittivities are exchanged without the need for a potentiometer to adjust the level switch to the new material.

Figure 3:
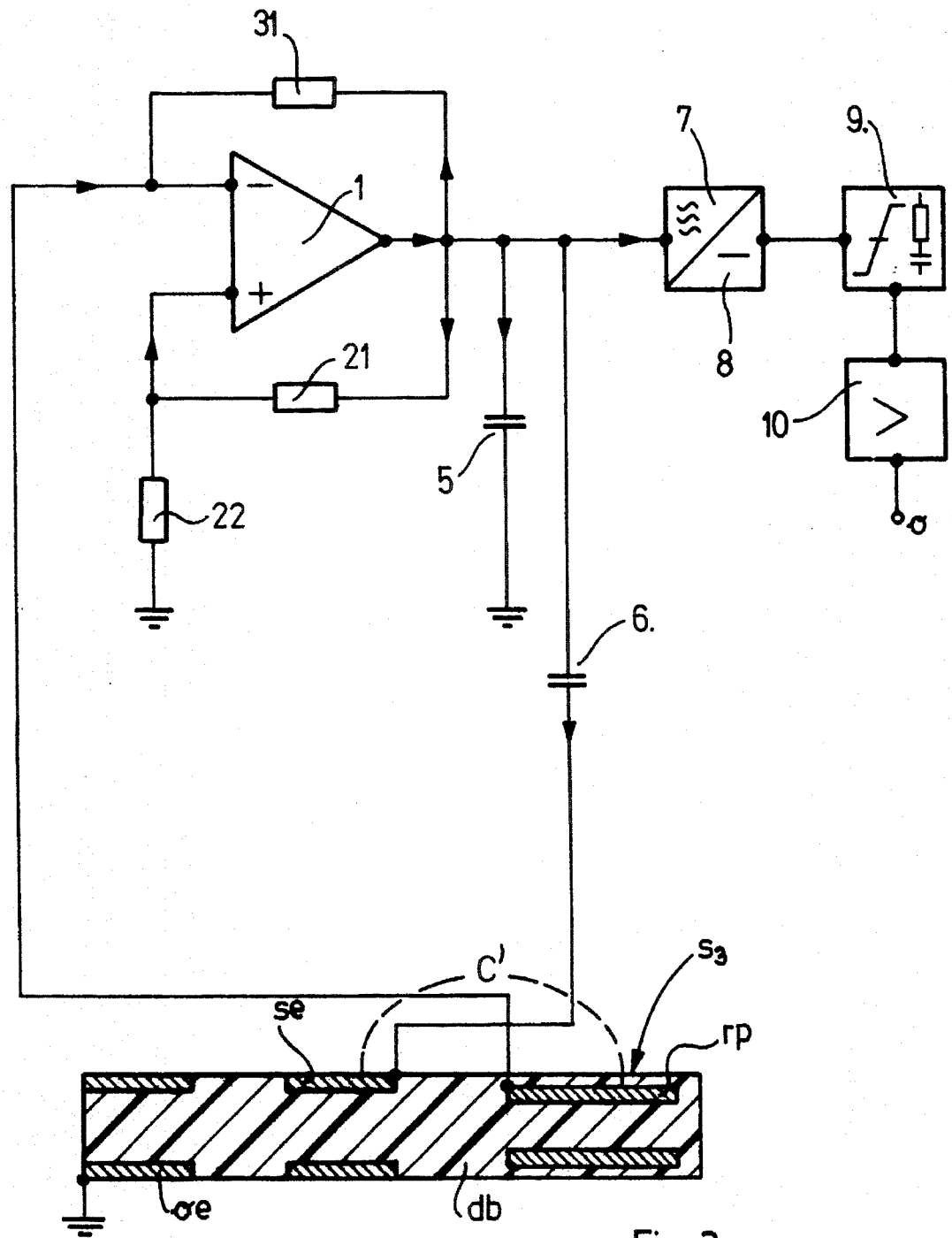
FIG. 3 represents a capacitive level switch in a further arrangement as the third embodiment of the level switch according to the invention.

The level switch of the third embodiment according to the invention is accomplished as a further arrangement of the capacitive level switch (FIG. 3). With respect to the level switch according to FIG. 2, the sensor $s_3$ and the circuit belonging hereto are made up in the following way. On the circumference of the dielectric body db of the sensor $s_3$ a screening electrode se is mounted between the opposite electrode oe and the ring plate rp. The screening electrode se is connected to the output of the operational amplifier 1 through the capacitor 6.

When describing the operation of the third embodiment of the level switch we start out from the operation of the level switch according to FIG. 2. Let us consider a difficult case of an electrically well conductive and sticking material. When the surface of the material sinks under the level of the sensor $s_3$, the layer sticking to the dielectric body db between the opposite electrode oe and the screening electrode se makes it possible that an electrical contact remains established from the output of the operational amplifier 1 through the capacitor 6 functioning as a low-frequency filter, through the screening electrode se and through the opposite electrode oe to the ground, and thereby the voltage amplitude at the output of the operational amplifier 1 is reduced. Besides, the screening electrode se virtually moves towards the ring plate rp and between them a virtual capacitor C' is formed, the capacity of which is low since its range of effectiveness is limited to the material layer surrounding the sensor $s_3$. For this reason the oscillator frequency is high and therefore one of the plates of the oscillator capacitor C', i. e. the screening electrode se, is brought to the output of the operational amplifier 1 by the capacitor 6. Furthermore the ring plate rp of the capacitor C' is connected to the output of the operational amplifier 1 through the resistor 31. To sum up, the capacity of the capacitor C' is low. Hence the oscillator frequency is very high and the high-frequency signal is conducted through the capacitor 5 to the circuit ground. The signal reaching the output o of the level switch is very weak, unlike the signal in the situation in which the surface of the material reaches over the level of the sensor $s_3$. In this situation the oscillator frequency is lower since the capacity of the capacitor C' is higher because of its larger range of effectiveness within the material.

By the screening electrode se the capacity of the level switch in FIG. 3 is increased as compared to the level switch in FIG. 2 since it is also appropriate for electrically well conductive materials which, however, at the same time intensely stick to the dielectric body db of the sensor $s_3$. The capacitive level switch in the third embodiment of the invention surpasses all hitherto known level switches as regards the diversity of materials in its application range.

Figure 4:
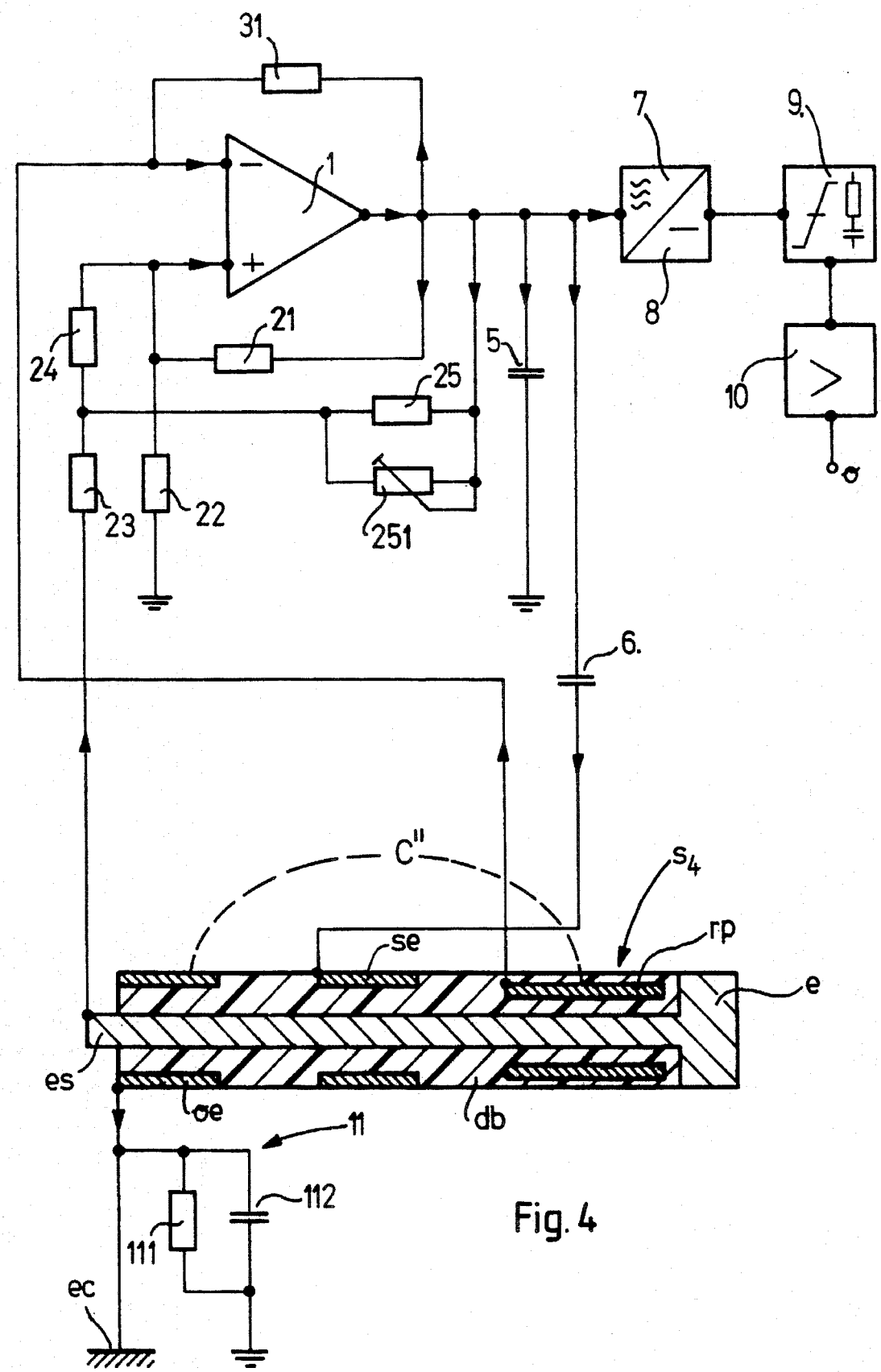
FIG. 4 represents a combined level switch as the fourth embodiment of the level switch according to the invention.

The level switch of the invention in the fourth embodiment is constructed as a combined conductive-capacitive level switch (FIG. 4). The sensor $s_4$ comprises an electrode e, an opposite electrode oe, a screening electrode se and a ringplate rp, which all are mounted on the cylindrical dielectric body db. Moreover, the annular opposite electrode oe surrounds one end of the dielectric body db and the ring plate rp is coaxially incorporated in the dielectric body db near to its other end, which body is terminated by the electrode e. On the circumference of the dielectric body db between the opposite electrode oe and the ring plate rp the screening electrode se is mounted. The metallic stem es of the electrode e axially penetrates through the dielectric body db and projects from the other end of the dielectric body db.

In the circuit of the fourth embodiment of the level switch of the invention, the inverting input of an operational amplifier 1 with positive and negative feedback accomplished by a resistor 21 and a resistor 31, respectively, is connected to a ring plate rp of the sensor $s_4$, and the non-inverting input of the operational amplifier 1 is connected through resistors 23, 24 connected in series to the free end of the electrode stem es of the electrode e. The screening electrode se is connected to the output of the operational amplifier 1 through a capacitor 6. The output of the operational amplifier 1 is connected to the common terminal of the resistors 23, 24 through a resistor 25 shunted by an adjustable resistor 251. A grounded resistor 22 is connected to the non-inverting input of the operational amplifier 1, the output of which is grounded through the capacitor 5. The output of the operational amplifier 1 is connected to the output o of the level switch through a low-frequency band filter 7, a rectifier 8, an amplitude limiter 9 and an amplifier 10, all connected in series.

For applications in electrically highly conductive materials with the conductivity between 0.1 S/cm and 1 S/cm and even higher, in order to prevent a deformation of the voltage amplitude on the sensor $s_4$, the annular opposite electrode oe is connected to the electric network ground ec and is connected to the level switch ground through a filter 11 consisting of a resistor 111 shunted by a capacitor 112.

By the adjustable resistor 251 the level switches provided with the sensor $s_4$ of different size are adjusted to the same sensitivity of response.

The screening electrode se has an effect both on the conductive and the capacitive part of the combined level switch, both effects being interlaced in a complex manner. In the conductive part there appears a material conductivity dependent positive feedback reaching from the output of the operational amplifier 1 through the capacitor 6 and through the material present between the screening electrode se and the electrode e back to the non-inverting input of the operational amplifier 1. Through the material surrounding the sensor $s_4$ the screening electrode se acts also as a voltage divider between the opposite electrode oe and the electrode e and thereby exerts an influence upon the voltage at the non-inverting input of the operational amplifier 1. In the capacitive part, however, the screening electrode se influences the forming of the virtual capacitor C", the plates of which are the ring plate rp and the opposite electrode oe. By the screening electrode se being connected to the output of the operational amplifier 1, the capacity of the capacitor C" is reduced. Thereby a too low oscillator frequency, especially in electrically highly conductive materials, is avoided. The capacity of the capacitor C", however, is influenced in the same manner also by the opposite electrode oe. On the one hand, the opposite electrode oe is connected to the non-inverting input of the operational amplifier 1, and on the other hand, it is in contact with the screening electrode se through the electrically highly conductive material.

Based on these considerations, we shall now describe the operation of the combined level switch according to the invention. Let us first assume that the sensor $s_4$ is immersed in a material which intensely sticks to the sensor $s_4$ and is electrically well conductive, e. g. a salted paste. The oscillator in the level switch circuit responds to such material as follows. The electrically well conductive material draws the ring plate rp and the opposite electrode oe, both forming the virtual capacitor C", apparently closer together. The capacitor C" is connected to the inverting input of the operational amplifier 1, the non-inverting input of which is grounded through the material present between the electrode e and the opposite electrode oe. The electrode e is also connected to a different input of the operational amplifier 1 from the ring plate rp and thereby decreases the capacity of the capacitor C". On the one hand the screening electrode se acts as an additional feedback, on the other hand, however, it acts depending on the electrical conductivity as a voltage divider and influences the voltage at the non-inverting input of the operational amplifier 1. The oscillator frequency depends on the adjusting influences already mentioned which are due to the presence of the material. However, when the surface of the material sinks under the level of the sensor $s_4$, the level switch of the invention responds irrespective of whether the electrically well conductive material to some extent was left behind sticking to the sensor $s_4$. As described above, the sticking layer of the electrically well conductive material helps the virtual capacitor C" to be formed, the capacity of which is strongly decreased by the electrode e and the opposite electrode oe. Namely, regarded spatially, the screening electrode se is situated between the ring plate rp and the opposite electrode oe while the electrode e and the screening electrode se are connected to the input and the output, respectively, of the feedbacked operational amplifier 1. Above all, the thickness of the material layer on the sensor $s_4$ is very limited, the appearance of the capacitor C", however, is bound to layers the thickness of which exceeds some minimum value. When the capacitor C" disappears the oscillator stops oscillating, which is detected by the shaping circuit connected to the output of the operational amplifier 1 and this is manifested in the signal at the output o of the combined level switch according to the invention. However, if the the thickness of the material layer should be sufficiently large for the capacitor C" to be formed, its capacity is low and therefore the oscillator frequency is high, approximately above 20 kHz. This signal is conducted through the capacitor 6, through the screening electrode se and through the material layer between the screening electrode se and the opposite electrode oe to the ground.

It follows from the above that for a good operation of the combined level switch of the invention under completely arbitrary conditions a careful evaluation of the circuit elements and of the sensor $s_4$ is necessary. Thus the mutual distances of the electrodes oe, se, e and the ring plate rp, and the diameter of the ring plate rp must be determined carefully in order that the screening electrode se would not prevent the appearance of the capacitor C". Also the quality of the dielectric is important from which the dielectric body db is made. The diameter of the stem es influences the parasitic capacity to the ring plate rp. It has been found that the oscillator frequency, when the material surface is above the level of the sensor $s_4$, is between 1 kHz and 20 kHz whereat the electrical conductivity of the material was between 10 pS/cm and 1 S/cm; hence the combined level switch operates reliably for electrically weakly conductive as well as for electrically highly conductive materials.

The combined level switch as the fourth embodiment of the level switch of the invention is applicable everywhere. The oscillator in the circuit of the level switch oscillates if only the sensor $s_4$ is immersed in a material with the electrical conductivity from a negligible value up to 1 S/cm, irrespective of the adherence of the material to the sensor $s_4$, whereat the material can be liquid, powdery or pasty. Hence the combined level switch also operates very well where traditional capacitive level switches fail to work, e. g. for a moist and hence electrically conductive powdery material.

Accordingly, the level switch of the invention operates in all embodiments with a constant voltage amplitude at the output of the oscillator, it is, however, the oscillator frequency which is changed when the surface of the material contained in the tank sinks under the level of the sensor $s_j$ (j=1, 2, 3 or 4). The sensitivity of response of the level switch is simply set at its production by the capacity of the capacitor 4 or 5, which functions as a frequency filter and connects the input of the operational amplifier 1 to the output of the low-frequency band filter 7. One and the same level switch of the invention, i. e. the electronic circuit and the sensor, controls all materials interesting in the industry or elsewhere.

What is claimed is:

1. A level switch comprising:

a dielectric body;

a first electrode terminating a first end of the dielectric body;

a second, grounded, opposite electrode surrounding a second end of the dielectric body;

said dielectric body, said first electrode and said second, grounded, opposite electrode together forming a sensor;

an operational amplifier having an inverting input, a non-inverting input and an output;

a first resistor connected to said non-inverting input and a second connected to said inverting input, resistor providing positive and negative feedback, respectively, to said operational amplifier;

a first capacitor through which the inverting input of the operational amplifier is grounded; and a third resistor through which the non-inverting input of the operational amplifier is connected to the first electrode.

2. A level switch as recited in claim 1, wherein the dielectric body is a cylindrical body and the opposite electrode has an annular form.

3. A level switch as recited in claim 1, and further comprising a signal shaping circuit connected to the output of the operational amplifier.

4. A level switch comprising:

a dielectric body;

a plate incorporated in the dielectric body;

a first, grounded, electrode mounted on a surface of the dielectric body;

a second, screening, electrode mounted on the surface of the dielectric body between the plate and the first electrode;

said dielectric body, said plate, said first, grounded, electrode and said second, screening, electrode together forming a sensor;

an operational amplifier having an inverting input, a non-inverting input and an output;

a first resistor connected to said non-inverting input and a second resistor connected to said inverting input, providing positive and negative feedback, respectively, to said operational amplifier;

a third resistor through which the non-inverting input of the operational amplifier is grounded; and a capacitor through which the screening electrode is connected to the output of the operational amplifier, the plate being connected to the inverting input of the operational amplifier.

5. A level switch as recited in claim 4, and further comprising an additional capacitor through which the output of the operational amplifier is grounded.

6. A level switch as recited in claim 5, wherein the dielectric body is a cylindrical body, the first electrode and the second electrode have annular forms and the plate is a ring plate coaxially incorporated in the dielectric body.

7. A level switch as recited in claim 6, and further comprising a signal shaping circuit connected to the output of the operational amplifier.

8. A level switch comprising:

a dielectric body;

a first electrode terminating a first end of the dielectric body;

a second, grounded, opposite electrode surrounding a second end of the dielectric body;

a plate incorporated in the dielectric body;

a third, screening, electrode mounted on a surface of the dielectric body between the plate and the second electrode;

said dielectric body, said first electrode, said second electrode, said plate and said third electrode together forming a sensor;

an operational amplifier having an inverting input, a non-inverting input and an output;

a first resistor connected to said non-inverting and a second resistor connected to said inverting input, providing positive and negative feedback, respectively, to said operational amplifier;

a third resistor through which the non-inverting input of the operational amplifier is grounded;

a capacitor through which the screening electrode is connected to the output of the operational amplifier, the plate being connected to the inverting input of the operational amplifier; and a fourth resistor through which the non-inverting input of the operational amplifier is connected to the first electrode.

9. A level switch as recited in claim 8, and further comprising an additional capacitor through which the output of the operational amplifier is grounded.

10. A level switch as recited in claim 9, wherein said fourth resistor includes a pair of individual resistors, connected in series, having a common terminal, and further comprising a fifth resistor through which the output of the operational amplifier is connected to said common terminal and an adjustable resistor for shunting said fifth resistor.

11. A level switch as recited in claim 10, and further comprising a filter, including an additional resistor and a further capacitor for shunting said additional resistor, for connecting the second electrode to a level switch ground.

12. A level switch as recited in claim 11, wherein the dielectric body is a cylindrical body, the second electrode and the third electrode have annular forms and the plate is a ring plate coaxially incorporated in the dielectric body.

13. A level switch as recited in claim 12, and further comprising a signal shaping circuit connected to the output of the operational amplifier.

* * * * *